(12) United States Patent
Kim

(10) Patent No.: US 7,459,262 B2
(45) Date of Patent: Dec. 2, 2008

(54) PHOTOIMAGEABLE, THERMOSETTABLE FLUORINATED RESISTS

(75) Inventor: Young H. Kim, Hockessin, DE (US)

(73) Assignee: E. I. duPont de Nemours and Company, Wilmington, DE (US)

( * ) Notice: Subject to any disclaimer, the term of this patent is extended or adjusted under 35 U.S.C. 154(b) by 7 days.

(21) Appl. No.: 11/375,674

(22) Filed: Mar. 13, 2006

(65) Prior Publication Data

US 2007/0092834 A1 Apr. 26, 2007

Related U.S. Application Data

(60) Provisional application No. 60/660,661, filed on Mar. 11, 2005.

(51) Int. Cl.
G03F 7/012 (2006.01)
C08F 114/18 (2006.01)
C08F 116/16 (2006.01)

(52) U.S. Cl. .................. 430/270.1; 430/280.1; 430/326; 526/242

(58) Field of Classification Search .............. 430/270.1, 430/280.1, 907, 910; 526/247, 249, 250, 526/253, 255, 266, 273, 328, 252, 242, 328.5
See application file for complete search history.

(56) References Cited

U.S. PATENT DOCUMENTS

| | | | |
|---|---|---|---|
| 2,928,865 A | | 3/1960 | Brasen et al. |
| 5,229,473 A | | 7/1993 | Kobo et al. |
| 5,401,812 A | * | 3/1995 | Yamamoto et al. .......... 525/426 |
| 5,958,648 A | | 9/1999 | Nishimura |
| 6,653,419 B1 | | 11/2003 | Petrov et al. |
| 6,723,488 B2 | | 4/2004 | Goodall |
| 2002/0119398 A1 | | 8/2002 | Desimone et al. |
| 2002/0196211 A1 | * | 12/2002 | Yumoto ....................... 345/76 |
| 2003/0003225 A1 | | 1/2003 | Choi et al. |
| 2003/0099858 A1 | * | 5/2003 | Duggal et al. ............... 428/690 |
| 2003/0120008 A1 | * | 6/2003 | Obayashi et al. ............ 526/247 |
| 2003/0143319 A1 | | 7/2003 | Park et al. |
| 2004/0021415 A1 | | 2/2004 | Vong et al. |
| 2004/0023157 A1 | * | 2/2004 | Feiring et al. ............. 430/272.1 |
| 2004/0214103 A1 | * | 10/2004 | Araki et al. .............. 430/270.1 |
| 2005/0265685 A1 | * | 12/2005 | Ohashi et al. ............... 385/147 |

FOREIGN PATENT DOCUMENTS

| | | | |
|---|---|---|---|
| WO | WO 00/66575 A2 | | 11/2000 |
| WO | WO 2004/014964 | * | 2/2004 |
| WO | WO 2004/016689 | * | 2/2004 |

OTHER PUBLICATIONS

S. Kho et. al., Passivation of Organic Light-Emitting Diodes by the Olasma Polymers Para-Xylene Thin Film, Jap. J. Appl. Phys. Part 2: Letters, 2002, vol. 41:1336-1338.
W.S Hong et. al., Fabrication of Novel TFT LCD Panels With High Aperture Ratio Using A-SiCO:H Films as a Passivation Layer, Mat. Res. Soc. Symp. Proc., 2003, vol. 762:265-270.
Thompson et. al., Introduction to Microlithography, 2nd Edition, 1994, American Chemical Society, Washington, DC. (Book Not Included).
R.P. Meagley et. al., Unique Polymers via Radical Diene Cyclization: Polyspironorbornanes and Their Application to 193 NM Microlithography, Chem. Comm., 1999, pp. 1587-1588.
F.M. Houlihan et. al., Synthesis of Cycloolefin—Maleic Anhydride Alternating Copolymers for 193 NM Imaging, Macromolecules, 1997, vol. 30:6517-6524.
T. Wallow et. al., Evaluation of Cycloolefin-Maleic Anhydride Alternating Copolymers as Single-Layer Photoresists for 193 NM Photolithography, SPIE, 1997, vol. 2724:355-364.
F.M. Houlihan et. al., A Commercially Viable 193 NM Single Layer Resist Platform, J. Photopolymer Sci & Technol., 1997, vol. 10: 511-520.
O. Okoroanyanwu et. al., New Single Layer Positive Photoresists for 193 NM Photolithography, SPIE, 1997, vol. 3049:92-103.
R. Allen et. al., Protecting Groups for 193 NM Photoresits, SPIE, vol. 2724:334-343.
J. Nui et. al., Polymers for 193NM Microlithography: Regioregular 2-Alkoxycarbonylnortricyclene Polymers by Controlled Cyclopolymerization of Bulky Ester Derivatives of Norbornadiene. Agnew Chem. Int. Ed., 1998, vol. 37:667-670.
Brodsky et. al., 157 NM Resist Materials: Progress Report, J. VA. Sci. Technol. B, 2000, vol. 18:3396-3401.

* cited by examiner

Primary Examiner—Cynthia H. Kelly
Assistant Examiner—Anca Eoff

(57) ABSTRACT

The present invention provides fluorinated, thermosettable compositions that are photoimageable and which function as low dielectric materials. Such low dielectric materials are useful as passivation resist layers in liquid crystal displays, electroluminescent displays, light emitting diodes and semiconductor manufacture.

16 Claims, No Drawings

PHOTOIMAGEABLE, THERMOSETTABLE FLUORINATED RESISTS

FIELD OF THE INVENTION

The present invention pertains to thermosettable polymers that are also photosensitive and useful as low dielectric materials. These polymers are particularly useful as a passivation layer in a variety of electronic devices and displays, including liquid crystal displays (LCD), light emitting diode (LED) displays and organic electroluminescent displays (OELD) and for semiconductors.

BACKGROUND

The manufacture of semiconductors, as in LCD technology, is generally a photolithographic process in which a solution of a resist material is applied as a thin coating over the substrate, heated to remove the solvent, and then subsequently exposed to electromagnetic radiation in an imagewise fashion, typically through a mask. Exposed areas of the photoresist are transformed chemically and/or physically to pattern a latent image that can then be developed by standard methods into a three-dimensional image. The resist film that remains after development serves as a protective mask, allowing the resist image to be transferred onto the substrate by etching or similar processes. Typically, the remaining resist film is stripped after the etching step, leaving an image of the desired circuit in the substrate. The process, together with other deposition processes, may be repeated many times to fabricate three-dimensional semiconductor devices. A passivation layer is often applied to protect the circuitry of the semiconductor devices from moisture and contamination.

In addition to being useful in LCDs, passivation layers may also be useful in applications such as organic electroluminescent displays (OELDs). In an OELD, a conductive transparent anode layer, a hole injection layer, a hole transport layer, an organic electroluminescent layer, an electron transport layer and a cathode layer are stacked successively on a transparent substrate, such as glass, quartz or the like. Because the organic material is sensitive to oxidation, moisture and contamination, the OELD also needs a passivation layer. See U.S. 2003/0003225, incorporated herein by reference.

Light emitting diodes (LEDs) are p-n junction devices, in which the electrons cross a forward-biased junction from the n- to the p-type material. The electron-hole recombination process produces some photons in the visible via electroluminescence, by which an exposed semiconductor surface can then emit light. A passivation layer is also used in LEDs. See U.S. 2004/021415, and Kho, S et al (2002) JAP J APPL PHYS, PART 2: LETTERS 41:1336-1338, both of which are incorporated herein by reference.

A passivation layer based on silicon dioxide or silicon nitride, also called a hard coat, may be deposited to cover and insulate the surface. See Hong, W S, et al. (2003) MAT. RES. SOC. SYMP. PROC. 762: 265-270; U.S. 2003/143319. The passivation layer may be variously termed a "gate insulating film" when covering the gate electrodes, or a "channel protection film" when covering the silicon layers. The passivation layer protects the gates and channels from moisture, contamination and/or mechanical damage. However, such hard coats are difficult and expensive to apply, typically requiring high-vacuum equipment and vapor deposition methods.

Various copolymer products for photoresist compositions that may be used as passivation coatings have been described in Thompson, L F, Willson, C G and Bowden, M J (1994) INTRODUCTION TO MICROLITHOGRAPHY, $2^{nd}$ Ed., American Chemical Society, Washington, D.C. In general, a photoresist composition may comprise a film-forming polymer, which may be photoactive, and a photosensitive composition, such as a photoacid generator, that includes one or more photoactive components. Upon exposure to electromagnetic radiation, e.g., visible (VIS) and ultraviolet (UV) light, the photoactive components of the copolymer can change various electromagnetic, physical or chemical characteristics of the photoresist composition, which include the rheological state, solubility, surface characteristics, refractive index and color, etc., as described in Thompson et al. (supra).

In some applications, it would be desirable to be able to image very fine features (at the submicron level) in the passivation layer. This requires use of electromagnetic radiation in the far or extreme UV range and a photoresist composition that is suitable for use at such wavelengths. The opacity of traditional aromatic-based photoresist materials precludes their use at 193 nm and shorter wavelengths, especially, in single-layer schemes.

Some photoresist compositions suitable for imaging at 193 nm are known, such as materials based on aliphatic polymers and dissolution inhibitors. See, e.g., Meagley, R P et al., CHEM. COMM. 1587 (1999); Houlihan, F M et al. (1997) MACROMOLECULES 30: 6517-6534; Wallow, T et al. (1997) SPIE 2724: 355-364; and Houlihan, F M et al. (1997) J PHOTOPOLYMER SCI & TECHNOL 10(3): 511-520, disclosing photoresist compositions comprising cycloolefin/maleic anhydride alternating copolymers useful for imaging of semiconductors at 193 nm. See also, Okoroanyanwu, O et al. (1997) SPIE 3049: 92-103; Allen, R et al. SPIE 2724: 334-343; and Niu, J and Frechet, J (1998) ANGEW CHEM INT ED 37(5): 667-670, focusing on 193 nm resists. For optical lithography at 157 nm, the incorporation of fluorine into polymers has begun to provide suitably transparent resist materials. See Brodsky et al., J. VA. SCI. TECHNOL. B 18:3396 (2000).

Although photoresist layers are typically removed after serving their protective role during the etching process, passivation layers become a permanent part of the semiconductor or display device. For this reason, materials used in the passivation layer must be mechanically robust and have good electrical insulating properties.

For the manufacture of various display and other electronic devices, there remains a need for a composition that serves as a photoresist and a passivation layer for use at 356 nm or lower wavelengths, which possesses high transparency in the visible (e.g., about 400-900 nm) and other valuable properties, especially for multiple-layer schemes. In particular, the passivation resist composition should be photoimageable, thermosettable and have a low dielectric constant that assures insulation. Photoimageability gives the resist patternability; thermosettability provides robustness and allows the resist to function as a retained dielectric layer between conducting layers.

SUMMARY

The present invention provides polymers that can serve as the basis for resist compositions possessing the composite characteristic of photoimageability with thermosettability and a low dielectric, insulating capacity. The present invention also provides resist compositions possessing this composite characteristic.

A first aspect of the present invention provides a polymer composition comprising:

a. a repeat unit derived from a fluoro-olefin selected from a group consisting of tetrafluoroethylene, hexafluoropropylene, chlorotrifluoroethylene, vinylidene fluoride, perfluoro-(2,2-dimethyl-1,3-dioxole), perfluoro-(2-methylene-4-methyl-1,3-dioxolane), and $CF_2\!=\!CFO(CF_2)_tCF\!=\!CF_2$, where t is 1 or 2, and $R_f''OCF\!=\!CF_2$ wherein $R_f''$ is a fluoroalkyl group of from 1 to 10 carbon atoms;

b. a repeat unit comprising at least one cross-linkable functional group, R, capable of cross-linking via acid-catalyzed ring-opening polymerization; and c. a repeat unit comprising at least one protected acid functional group.

The cross-linkable functional group is desirably capable of being cross-linked by acid-catalyzed ring-opening polymerization.

A second aspect provides a photoimageable composition comprising:

a. a repeat unit derived from a fluoro-olefin selected from tetrafluoroethylene, hexafluoropropylene, chlorotrifluoroethylene, vinylidene fluoride, perfluoro-(2,2-dimethyl-1,3-dioxole), perfluoro-(2-methylene-4-methyl-1,3-dioxolane), $CF_2\!=\!CFO(CF_2)_tCF\!=\!CF_2$, where t is 1 or 2, and $R_f''OCF\!=\!CF_2$ wherein $R_f''$ is a fluoroalkyl group of from 1 to 10 carbon atoms;

b. a repeat unit comprising at least one cross-linkable functional group c. a repeat unit comprising at least one protected acid functional group; and d. a photoactive component.

Another aspect provides a thermosettable composition comprising a polymer composition of this invention and an acid catalyst or a photoacid generator.

A further aspect provides films and articles comprising a polymer composition or thermosettable composition of this invention.

Another aspect provides a thermoset process comprising heating a thermosettable composition of this invention, or exposing the thermosettable composition to light to generate an acid photochemically. Also provided are films or articles made by the thermoset process.

DETAILED DESCRIPTION OF THE PREFERRED EMBODIMENTS

Before describing the present invention in detail, it is to be understood that this invention is not limited to the following exemplary embodiments but is embodied in various aspects. The exemplary embodiments are provided to perfect the disclosure of the invention and to give one of ordinary skill in the art an understanding of the scope of the invention. In the specification and the claims, the singular forms "a", "an" and "the" includes plural referents unless the context clearly dictates otherwise.

Definitions. The following definitions apply for the interpretation of the claims and of the specification:

As used herein, "acid-catalyzed" refers to chemical reactions that form the basis for essentially all chemically amplified resist systems for microlithography applications. These reactions are generally classified as either cross-linking (photopolymerization) or deprotection reactions.

As used herein, "derived from" refers to the preparation of one organic substance from another, e.g., an organic compound containing a structural radical similar to that compound which it was prepared.

As used herein, "protected acid functional group" refers to a functional group that protects a fluorinated alcohol group and/or other acid group (i.e., the protected group) from exhibiting its acidity while in this protected form. As one illustrative example, the tertiary-butyl group is the protecting group in a tertiary-butyl ester and this protecting group protects the free acid. In undergoing deprotection (conversion of protected acid to free acid), the ester is converted to the corresponding acid.

As used herein, "photoimageable" refers to a composition that changes the solubility of the polymer by radiation. As used herein, a "photoacid generator" refers to a compound especially added to a formulation to convert absorbed light energy, UV or visible light, into chemical energy in the form of a proton.

As used herein, "photoactive" refers to a component of the resist material that reacts in response to the actinic radiation. Another term for this component is sensitizer. It is the sensitizer that gives the resist its developer resistance and radiation absorption properties.

As used herein, "polymer" includes the term "co-polymer" and these two terms may be used herein interchangeably when the context dictates.

All other terms are defined by reference to the following: WEBSTER'S THIRD NEW INTERNATIONAL DICTIONARY, Unabridged, Merriam-Webster, Springfield, Mass. (1993); Lewis, R J, HAWLEY'S CONDENSED CHEMICAL DICTIONARY, 14$^{th}$ Ed., John Wiley & Sons, New York, N.Y. (2001); and Thompson, L F, Willson, C G and Bowden, M J (1994) INTRODUCTION TO MICROLITHOGRAPHY, 2$^{nd}$ Ed., American Chemical Society, Washington, D.C.

The present invention provides a fluorinated polymer, that is, the polymer comprises at least one repeat unit derived from a fluoro-olefin; at least one functional unit capable of crosslinking via acid-catalyzed ring-opening polymerization; and at least one repeat unit having at least one protected acid functional group. Preferred functional groups capable of crosslinking via acid-catalyzed ring-opening polymerization include those that contain a glycidyl group. For example, the polymer can contain repeat units derived from glycidyl acrylate.

The present polymer may comprise a repeat unit derived from a compound containing functional group, R, wherein R has the following structure.

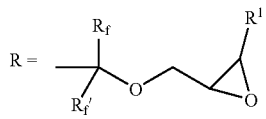

$R_1$ is H or $C_1$-$C_3$ alkyl, preferably H. This functional group also contains fluoroalkyl groups, designated $R_f$ and $R_f'$, which can be partially or fully fluorinated alkyl groups. $R_f$ and $R_f'$ are independently the same or different fluoroalkyl groups of from 1 to 10 carbon atoms. Alternatively, they may be taken together and are $(CF_2)_n$ wherein n is 2 to 10. The terms "taken together" indicate that $R_f$ and $R_f'$ are not separate, discrete fluorinated alkyl groups, but that together they form a ring structure such as is illustrated below in case of a 5-membered ring:

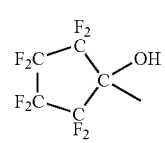

Preferably, $R_f$ and $R_f'$ are independently perfluoroalkyl groups of 1 to 5 carbon atoms, most preferably, trifluoromethyl ($CF_3$). Repeat units of this type are generally derived from the corresponding fluoroalcohol by reaction of the fluoroalcohol with an appropriate epoxide, e.g., epichlorohydrin.

One or more repeat units of the present polymer may be cyclic or polycyclic. Suitable polycyclic repeat units include those derived from:

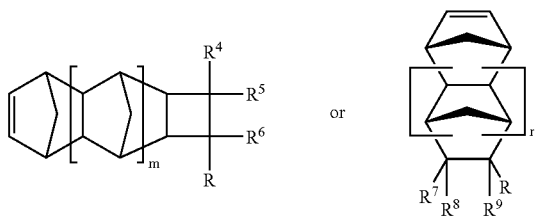

wherein m and r are 0, 1, or 2; and $R^4$ to $R^9$ are independently H; $C_1$-$C_{10}$ alkyl or alkoxy, optionally substituted by halogen or ether oxygens, and R is as defined above.

Some illustrative, but nonlimiting, examples of suitable, fluoroalcohols are presented below:

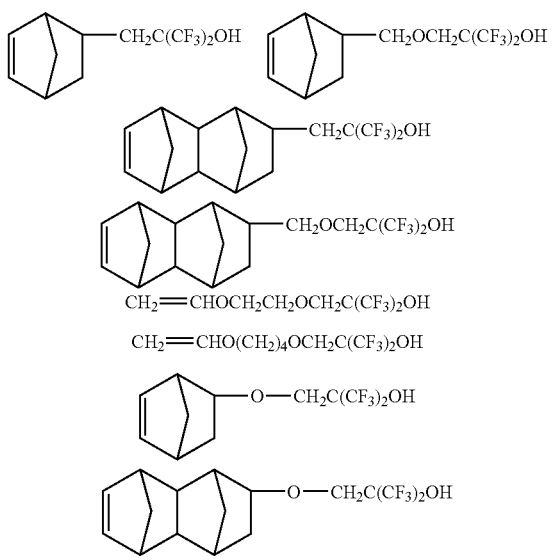

The polymer may further comprise a repeat unit derived from an acrylate monomer, $CH_2=CR^2CO_2R^3$, where $R^2$ is H, F, $C_1$-$C_3$ alkyl or hydroxyalkyl, and $R^3$ is an acid-protecting group. Suitable $R^3$ groups include substituted and unsubstituted tertiary and cyclic alkyl groups. Suitable $CO_2R^3$ ester groups include, but are not limited to: A) esters capable of forming, or rearranging to, a tertiary cation; B) esters of lactones; C) acetal esters; D) □-cyclic ketone esters; E) □-cyclic ether esters; and F) esters which are easily hydrolyzable because of anchimeric assistance, such as MEEMA (methoxy ethoxy ethyl methacrylate). Some specific examples in category A) are t-butyl ester, 2-methyl-2-adamantyl ester, and isobornyl ester. Preferred polymers for use in this invention have a molecular weight above that of chain entitlement, e.g., of about 10,000 and greater.

The polymer composition can also comprise a repeat unit derived from a fluoroolefin of 2 to 20 carbon atoms. Representative fluoroolefins include, but are not limited to, tetrafluoroethylene, hexafluoropropylene, chlorotrifluoroethylene, vinylidene fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a fluoroalkyl group of from 1 to 10 carbon atoms. A preferred fluoroolefin is tetrafluoroethylene.

The present invention also provides a photoimageable composition comprising the present polymer and at least one photoactive component (PAC), described below.

Polymerization Process

The preferred process for producing the present polymers is radical addition polymerization. Bulk polymerization or solution polymerization may be employed. Any suitable polymerization initiator, such as di-(4-tert-butylcyclohexyl) peroxy-dicarbonate, may be used under appropriate conditions. The polymerization pressure may range from about 50 to about 10,000 psig, preferably from about 200 to about 1,000 psig. The polymerization temperature may range from about 30° C. to about 120° C., preferably from about 40° C. to about 80° C. Suitable solvents include 1,1,2-trichlorofluoroethane and non-chlorofluorocarbon solvents, such as 1,1,1,3,3-pentafluorobutane.

The polymerization process may be further enhanced by a semi-batch synthesis. In such synthesis, a part of the monomer mixture is placed in the reaction vessel and then, portionwise or continuously, the remaining monomers and initiator are added to the vessel throughout the polymerization process.

The presnence of fluorine-containing repeat units in the polymer compositions disclosed herein can provide polymers with high transmittance of light in the visible and UV-A region. The presence of fluorine in the polymer tends to lower the dielectric constant of the polymer, which is a desirable characteristic for some applications, especially to foster the use of a photoimageable polymer in silicon wafer circuitry as a dielectric material between conducting layers.

Photoactive Component (PAC)

The polymers can be made photoimageable by combining the copolymers with at least one photoactive component (PAC), a compound that yields either acid or base upon exposure to actinic radiation. If an acid is produced upon exposure to actinic radiation, the PAC is termed a photoacid generator (PAG). If a base is produced upon exposure to actinic radiation, the PAC is termed a photobase generator (PBG). Several suitable photoacid generators are disclosed in WO 00/66575, which is incorporated herein by reference.

Dissolution Inhibitors and Additives

Various dissolution inhibitors (DI) can be added to photoimageable compositions derived from the copolymers disclosed herein. Ideally, the mix of dissolution inhibitors and additives should be designed/chosen to impart not only dissolution inhibition to the resultant composition but also plasma etch resistance, and the desired adhesion behavior. Some dissolution inhibiting compounds also serve as plasticizers in resist compositions. Several suitable dissolution inhibitors are disclosed in U.S. Pat. No. 6,653,419, which is incorporated herein by reference.

Positive-Working and Negative-Working Photoresists

Photoimageable compositions derived from the polymers disclosed herein can either be positive- or negative-working, depending upon choice of components in the fluoropolymer, the presence or absence of optional dissolution inhibitor and crosslinking agents, and the choice of solvent used in development. The choice of all of these components is well within the skill of an ordinary artisan in this field.

Other Components

The polymer compositions can contain additional optional components. Examples of optional components include, but are not limited to, resolution enhancers, adhesion promoters, residue reducers, coating aids, plasticizers, and $T_g$ (glass transition temperature) modifiers. Choosing these additional components is also well within the skill of an ordinary artisan in this field.

Curing the Thermosettable Polymer

Curing the thermosettable polymer is accomplished via an acid-catalyzed reaction, the fundamental reaction underlying chemically amplified resist systems for microlithography applications. These reactions are generally classified as either cross-linking (photopolymerization) or deprotection. Deprotection reactions are used to unmask acidic functionality such as phenolic or pendent carboxylic acid groups, and thus lend themselves to positive-working resist applications. On the other hand, acid-catalyzed polymer cross-linking and photo-polymerization reactions are used in negative-working resist systems.

The thermosettable polymer can be cured by crosslinking of the pendant cross-linkable group through acid-catalyzed ring-opening polymerization, in which the necessary acid is either added to the present polymer composition, or preferably generated photolytically or thermally by means of a photoacid generator. The relative amount of pendant cross-linkable group and the acid labile ester is important during the curing step.

For the film remaining after development, "flood" irradiation, that is, exposure to radiation without the use of a mask, generates a strong non-nucleophilic acid. Upon the first heating at 120° C. after UV radiation, the ester group is cleaved and becomes a free carboxylic acid. Alternatively, a strong non-nucleophilic acid can be generated by heating above the thermal decomposition of a PAG, typically above 180° C. Then the strong non-nucleophilic acid will start to catalyze ring-opening polymerization of the epoxide. During the ring opening polymerization, there will be a number of competing reactions with the polymerization. An important competing reaction is esterification of the free carboxylic acid with the epoxide. It is believed that reduction of the free carboxylic acid levels by esterification with epoxides will lead to materials with lower dielectric constants and increased hydrophobicity. In this way, the degree of esterification will affect the dielectric property as well as the hydrophobicity of the cured polymer.

EXAMPLES

Unless otherwise specified, all temperatures are in degrees Celsius, all mass measurements are in grams, and all percentages are weight percentages.

Abbreviations of Chemicals/Monomers. The following abbreviations apply for the interpretation of the claims and the specification:

| | |
|---|---|
| DMF | Dimethylformamide |
| ELD (OELD) | Electroluminescent display (Organic ELD) |
| GA | Glycidyl acrylate |
| | Monomer-Polymer & Dejac Labs, Inc. |
| | Feasterville, PA |
| LCD | Liquid Crystal Display |
| LED (OLED) | Light Emitting Diode (Organic LED) |
| NB-F—OH | (norbornene with —OCH$_2$C(CF$_3$)$_2$OH substituent) |
| NB-F—O-Gly | (norbornene with —OCH$_2$C(CF$_3$)$_2$OCH$_2$-epoxide substituent) |
| Solkane® 365 mfc | 1,1,1,3,3-Pentafluorobutane |
| | Solvay Fluor, Hannover, Germany |
| t-BuAc | tert-Butyl acrylate |
| | Sigma-Aldrich Chemical Company, Milwaukee, WI |
| TFE | Tetrafluoroethylene |
| | E. I. DuPont de Nemours & Co., Inc. |
| | Wilmington, DE |

Example 1

Polymer of TFE, NB—F—OH, NB—F—O-Gly and t-BuAc

The monomer NB—F—O-Gly is prepared by reaction of NB—F—OH with epichlorohydrin (Sigma-Aldrich Chemical Company) in the presence of base according to the procedure described by Maruno, Nakamura and Murata (Macromolecules, volume 29, pages 2006 to 2010 (1996)).

Synthesis of NB—F—OH

A dry, round-bottom flask equipped with mechanical stirrer, addition funnel and nitrogen inlet is swept with nitrogen and charged with 19.7 g (0.78 mol) of 95% sodium hydride and 500 mL of anhydrous DMF. The stirred mixture is cooled to 5° C. and 80.1 g (0.728 mol) of exo-5-norbornen-2-ol is added dropwise so that the temperature remains below 15° C. The resulting mixture is stirred for 0.5 hr. HFIBO (131 g, 0.728 mol) is added dropwise at room temperature. The resulting mixture is stirred overnight at room temperature. Methanol (40 mL) is added and most of the DMF is removed on a rotary evaporator under reduced pressure. The residue is treated with 200 mL water, and glacial acetic acid is added until the pH is about 8.0. The aqueous mixture is extracted with 3×150 mL ether. The combined ether extracts are washed with 3×150 mL water and 150 mL brine, dried over anhydrous sodium sulfate, and concentrated on a rotary evaporator to an oil. Kugelrohr distillation at 0.15-0.20 torr and a pot temperature of 30-60° C. gives the desired product.

Synthesis of Polymer

A metal pressure vessel of approximate 270 mL capacity is charged with 56.55 g NB—F—OH, 17.3 g NB—F—O-Gly, 0.64 g tert-butyl acrylate, and 25 mL Solkane® 365. The vessel is closed, cooled to about −15° C. and pressured to 400 psi with nitrogen and vented several times. The reactor contents are heated to 50° C. TFE is added to a pressure of 340 psi and a pressure regulator is set to maintain the pressure at 340 psi throughout the polymerization by adding TFE as required. A solution of 66.46 g of NB—F—OH, 19.22 g of NB—F—

O-Gly and 7.68 g of tert-butyl acrylate diluted to 100 mL with Solkane® 365 mfc is pumped into the reactor at a rate of 0.10 mL/min for 12 hr. Simultaneously with the monomer feed solution, a solution of 7.3 g Perkadox® 16N and 60 mL methyl acetate diluted to 100 mL with Solkane® 365 mfc is pumped into the reactor at a rate of 2.0 mL/min for 6 min, and then at a rate of 0.1 mL/min for 8 hr. After 16 hr reaction time, the vessel is cooled to room temperature and vented to 1 atm. The recovered polymer solution is added slowly to an excess of hexane while stirring. The precipitate is filtered, washed with hexane and air-dried. The resulting solid is dissolved in a mixture of THF and Solkane® 365 mfc and added slowly to excess hexane. The precipitate is filtered, washed with hexane and dried in a vacuum oven overnight to give a polymer comprising fluoroalcohol groups, glycidyl groups and tertiary butyl ester groups.

Example 2

Polymer of TFE, NB—F—OH, t-BuAc and GA

A metal pressure vessel of approximate 270 mL capacity is charged with 70.33 g NB—F—OH, 0.64 g t-BuAc, 0.32 g GA and 25 mL Solkane® 365. The vessel is closed, cooled to about −15° C. and pressured to 400 psi with nitrogen and vented several times. The reactor contents are heated to 50° C. TFE is added to a pressure of 340 psi and a pressure regulator is set to maintain the pressure at 340 psi throughout the polymerization by adding TFE as required. A solution of 80.56 g of NB—F—OH, 7.68 g of tert-butyl acrylate and 2.67 g GA diluted to 100 mL with Solkane® 365 mfc is pumped into the reactor at a rate of 0.10 mL/min for 12 hr. Simultaneously with the monomer feed solution, a solution of 7.3 g Perkadox® 16N and 60 mL methyl acetate diluted to 100 mL with Solkane® 365 mfc is pumped into the reactor at a rate of 2.0 mL/min for 6 min, and then at a rate of 0.1 mL/min for 8 hr. After 16 hr reaction time, the vessel is cooled to room temperature and vented to 1 atm. The recovered polymer solution is added slowly to an excess of hexane while stirring. The precipitate is filtered, washed with hexane and air-dried. The resulting solid is dissolved in a mixture of THF and Solkane® 365 mfc and added slowly to excess hexane. The precipitate is filtered, washed with hexane and dried in a vacuum oven overnight to give a polymer comprising fluoroalcohol groups, glycidyl groups and tertiary butyl ester groups.

Example 3

Radiation and Thermal Curing of Epoxide

Polymer prepared as in Example 1 (1.097 grams), 0.485 grams Cyracure® UVI-6976, and 0.08 grams Quanticure ITX (Sigma-Aldrich) are dissolved to a clear solution in 2.546 grams of propylene glycol 1-monomethyl ether 2-acetate. The solution is spin coated at 3000 rpm onto a substrate to give about 1 micron thick films. The film is then dried for 2 min at 90° C. on a hot plate. The film is exposed with approximate 600 mJ/cm² broad band UV light using a 20 micron photomask, then heat treated on a hot plate at 120° C. for 2 min. The imaged part is developed by dipping into AZ 300 developer. The remaining film is rinsed with water for 1 min, and then dried at 90° C. for 1 min. This film is flood exposed with a mercury lamp UV light for 50 to 2000 mJ/cm², then heat treated at 120° C. for 2 min, followed by heating the film at 250° C. for 100 min. The film is cured at this point.

What is claimed is:

1. A polymer composition comprising:
  (a) a repeat unit derived from a fluoro-olefin selected from a group consisting of tetrafluoroethylene, hexafluoropropylene, chlorotrifluoroethylene, vinylidene fluoride, perfluoro-(2,2-dimethyl-1,3-dioxole), perfluoro-(2-methylene-4-methyl-1,3-dioxolane), and $CF_2=CFO(CF_2)_tCF=CF_2$, where t is 1 or 2, and $R_f''OCF=CF_2$ wherein $R_f''$ is a fluoroalkyl group of from 1 to 10 carbon atoms;
  (b) a repeat unit comprising at least one cross-linkable functional group, R, having the following structure

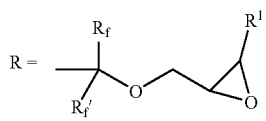

wherein $R^1$ is H or $C_1$-$C_3$ alkyl, and $R_f$ and $R_f'$ taken together are $(CF_2)_n$ wherein n is 2 to 10; and
  (c) a repeat unit comprising at least one protected acid functional group.

2. The polymer of claim 1, wherein the repeat unit comprising a protected acid functional group is derived from an acrylate monomer, $CH_2=CR^2CO_2R^3$, wherein $R^2$ is H, F, $C_1$-$C_3$ alkyl or hydroxyalkyl, and $R^3$ is an acid-protecting group.

3. The polymer of claim 2, wherein $R^3$ is a substituted or unsubstituted tertiary alkyl or cyclic alkyl group.

4. A photoimageable composition comprising:
  (a) a repeat unit derived from a fluoro-olefin selected from tetrafluoroethylene, hexafluoropropylene, chlorotrifluoroethylene, vinylidene fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a fluoroalkyl group of from 1 to 10 carbon atoms;
  (b) a repeat unit comprising at least one functional group, R, having the followimg structure

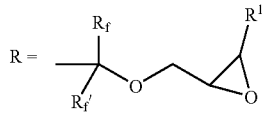

wherein $R^1$ is H or $C_1$-$C_3$ alkyl, and $R_f$ and $R_f'$ taken together are $(CF_2)_n$ wherein n is 2 to 10;
  (c) a repeat unit comprising at least one protected acid functional group; and
  (d) a photoacid generator.

5. A thermosettable composition comprising:
  (a) a repeat unit derived from a fluoro-olefin selected from tetrafluoroethylene, hexafluoropropylene, chlorotrifluoroethylene, vinylidene fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a fluoroalkyl group of from 1 to 10 carbon atoms;
  (b) a repeat unit comprising at least one functional group, R, having the following structure

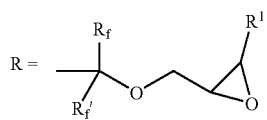

wherein $R^1$ is H or $C_1$-$C_3$ alkyl, and $R_f$ and $R_f'$ taken together are $(CF_2)_n$, wherein n is 2 to 10;

(c) a repeat unit comprising at least one protected acid functional group; and (d) an acid catalyst.

6. The thermosettable composition of claim 5, wherein the acid catalyst is generated from a photoacid generator.

7. A thermoset process comprising heating a thermosettable composition of claim 5 or 6.

8. A thermoset product comprising a polymer composition according to claim 1.

9. an article comprising the thermoset product of claim 8.

10. The thermoset product of claim 8, which has a dielectric constant, wherein the dielectric constant is less than 3.0.

11. An article comprising a silicon wafer and the thermoset product of claim 8.

12. An electronic device comprising the article of claim 11.

13. A photoimageable and thermosettable composition comprising:

(a) a repeat unit derived from a fluoro-olefin selected from tetrafluoroethylene, hexafluoropropylene, chlorotrifluoroethylene, vinylidene fluoride, perfluoro-(2,2-dimethyl-1,3-dioxole), perfluoro-(2-methylene-4-methyl-1,3-dioxolane), $CF_2=CFO(CF_2)_tCF=CF_2$, where t is 1 or 2, and $R_f''OCF=CF_2$ wherein $R_f''$ is a fluoroalkyl group of from 1 to 10 carbon atoms;

(b) a repeat unit comprising at least one functional group, R, having the following structure

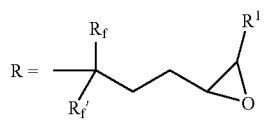

wherein $R^1$ is H or $C_1$-$C_3$ alkyl, and $R_f R_f'$ taken together are $(CF_2)_n$, wherein n is 2 to 10;

(c) a repeat unit comprising at least one protected acid functional group; and (d) a photoacid generator.

14. An organic light emitting diode comprising the composition of any one of claim 1, 4, 5, or 13.

15. The article of claim 9, wherein the article is a film. A liquid crystal display comprising the composition of any one claims 1, 4, 5, or 13.

16. The article of claim 9, wherein the article is a film.

* * * * *